US008775984B2

(12) United States Patent
Chang et al.

(10) Patent No.: US 8,775,984 B2
(45) Date of Patent: *Jul. 8, 2014

(54) PHASE COHERENT DIFFERENTIAL STRUCTURES

(75) Inventors: Mau-Chung Frank Chang, Los Angeles, CA (US); Daquan Huang, Allen, TX (US)

(73) Assignee: The Regents of the University of California, Oakland, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 12/979,684

(22) Filed: Dec. 28, 2010

(65) Prior Publication Data

US 2011/0210767 A1 Sep. 1, 2011

Related U.S. Application Data

(63) Continuation of application No. 11/997,352, filed as application No. PCT/US2006/029165 on Jul. 26, 2006, now Pat. No. 7,886,239.

(60) Provisional application No. 60/705,869, filed on Aug. 4, 2005.

(51) Int. Cl.
*G06F 17/50* (2006.01)
*H03B 19/00* (2006.01)
*H03K 3/00* (2006.01)

(52) U.S. Cl.
USPC ........... 716/100; 716/109; 716/110; 716/132; 716/139; 327/116; 327/117; 327/236; 327/270

(58) Field of Classification Search
USPC .......... 716/100, 109, 110, 132, 139; 327/116, 327/117, 236, 270
See application file for complete search history.

(56) References Cited

U.S. PATENT DOCUMENTS

| | | | | | |
|---|---|---|---|---|---|
| 3,644,835 | A | * | 2/1972 | Thompson | 327/3 |
| 3,805,173 | A | * | 4/1974 | Nakamura et al. | 327/236 |
| 4,097,773 | A | | 6/1978 | Lindmark | |
| 4,771,238 | A | * | 9/1988 | Caruso et al. | 324/229 |
| 4,890,214 | A | * | 12/1989 | Yamamoto | 363/49 |
| 5,357,419 | A | | 10/1994 | Limpaecher | |
| 5,570,258 | A | * | 10/1996 | Manning | 361/85 |
| 5,642,065 | A | | 6/1997 | Choi et al. | |
| 5,900,745 | A | * | 5/1999 | Takahashi | 326/64 |
| 6,034,624 | A | | 3/2000 | Goto et al. | |
| 6,043,660 | A | | 3/2000 | Bahr et al. | |
| 6,323,910 | B1 | | 11/2001 | Clark, III | |
| 6,346,912 | B1 | * | 2/2002 | Reinhart et al. | 342/385 |

(Continued)

FOREIGN PATENT DOCUMENTS

JP    2005108607 A  *  4/2005

OTHER PUBLICATIONS

Huang et al.—"A phase-coherent transformer enabled 2:1 frequency divider with 7dB phase noise reduction and speedxgain/power F.O. M. of 2x10 (pico-Joule)-1"—VLSI Circuits, Digest of Technical Papers, 2005, pp. 82-85.

(Continued)

*Primary Examiner* — Helen Rossoshek
(74) *Attorney, Agent, or Firm* — John P. O'Banion

(57) ABSTRACT

Phase-coherent differential structures contain a phase-coherent transformer having two pairs of phase-coherent coupled differential inductors.

17 Claims, 7 Drawing Sheets

(56) References Cited

U.S. PATENT DOCUMENTS

| | | |
|---|---|---|
| 6,388,896 B1 | 5/2002 | Cuk |
| 6,535,037 B2 | 3/2003 | Maligeorgos |
| 6,556,089 B2 * | 4/2003 | Wood ............................... 331/57 |
| 6,590,351 B2 * | 7/2003 | Huber ............................ 315/291 |
| 6,667,893 B2 * | 12/2003 | Daun-Lindberg et al. ...... 363/65 |
| 6,826,393 B1 | 11/2004 | Komurasaki et al. |
| 6,831,497 B2 | 12/2004 | Koh et al. |
| 6,838,886 B2 | 1/2005 | Hilliard et al. |
| 7,019,993 B2 | 3/2006 | Vazquez Carazo |
| 7,272,071 B2 * | 9/2007 | Notthoff ....................... 365/242 |
| 7,463,108 B2 | 12/2008 | Horng et al. |
| 7,884,660 B2 * | 2/2011 | Delage et al. ................. 327/270 |
| 7,919,985 B2 * | 4/2011 | Green ............................ 326/83 |
| 7,940,097 B2 * | 5/2011 | Chen ............................ 327/158 |
| 8,325,001 B2 * | 12/2012 | Huang et al. .................. 336/200 |
| 2003/0205990 A1 | 11/2003 | Wittenbreder |
| 2004/0196083 A1 * | 10/2004 | Dunsmore .................... 327/231 |
| 2008/0191754 A1 | 8/2008 | Chang et al. |

OTHER PUBLICATIONS

Laskin et al.—"Low-Power, Low-Phase Noise SiGe HBT Static Frequency Divider Topologies up to 100 GHz"—Bipolar/BiCMOS Circuits and Technology Meeting, 2006, pp. 1-4.

Taniguchi et al.—"A 2 GHz-band self frequency dividing quadrature mixer"—Radio Frequency Integrated Circuits (RFIC) Symposium, Digest of Papers. 2005 IEEE, pp. 505-508.

WIPO, International Publication No. WO 2007/019066 dated Feb. 15, 2007, including international search report and written opinion issued on Jul. 20, 2007, from counterpart PCT Application No. PCT/US2006/029165, pp. 1-25.

* cited by examiner

PHASE COHERENT DIFFERENTIAL STRUCTURES

CROSS-REFERENCE TO RELATED APPLICATIONS

This application is a continuation of U.S. patent application Ser. No. 11/997,352 filed on Jan. 30, 2008, now U.S. Pat. No. 7,886,239, incorporated herein by reference in its entirety, which is a national stage entry of PCT/US2006/029165 filed on Jul. 26, 2006, incorporated herein by reference in its entirety, which claims priority to U.S. provisional patent application Ser. No. 601705,869 filed on Aug. 4, 2005, incorporated herein by reference in its entirety.

STATEMENT REGARDING FEDERALLY SPONSORED RESEARCH OR DEVELOPMENT

This invention was made with Government support under Grant Number N66001-04-1-8934 awarded by the U.S. Navy. The Government has certain rights in the invention.

FIELD

The present invention relates to differential structures. More particularly, the present invention relates to power-efficient, low phase noise differential structures that are tolerant of differential input phase mismatch.

BACKGROUND

Due to the high market demand for new wireless technologies, there is great interest in developing differential structures such as, for example, frequency dividers that are able to efficiently operate at high frequencies with large division gain.

The frequency divider is one of the key building blocks of phase-locked loops (PLLs) in communications systems that use frequency synthesizers for wireless and Serial/Deserialized (Ser/Des) for wired/optical applications.

Current technology utilizes conventional twist-coupled toggle latch based frequency dividers that store electrical energy non-coherently in the parasitic capacitances. However, the conventional twist-coupled toggle latch based frequency dividers waste energy and generate noise through the charging/discharging process. A more power efficient topology that introduces less noise to the signal would be highly desirable for future wireless technologies such as RF/millimeter wave systems.

Typical divider designs are reported in the following literature and graphed in FIG. 7.

[1] M. Wurser, et al, "42 GHz Static Frequency Divider in a Si/SiGe Bipolar Technology," ISSCC Digest of Tech. Papers, 1997, pp. 86-87.
[2] Z. Lao, et al., "55 GHz Dynamic Frequency Divider IC," Elec. Let. 34 (20), 1998, pp. 1973-1974.
[3] A. Felder, et al., "Static Silicon Frequency Divider for Low Power Consumption (4 mW, 10 GHz) and High-Speed (160 mW, 19 GHz)," Proceedings, IEEE BCTM, 1992, pp. 159-162.
[4] B. Razavi, et al., "A 13.4 GHz CMOS Frequency Divider," ISSCC Digest of Tech. Papers, 1994, pp. 176-177.
[5] H. Wang, "A 1.8V 3 mW 16.8 GHz Frequency Divider in 0.25 μm CMOS," ISSCC Digest of Tech Papers, 2000, pp. 196-197.
[6] H, Knapp, et al., "25 GHz Static Frequency Divider and 25 GB/s Multiplexer in 0.12 μm CMOS," ISSCC, Digest of Tech. Papers, 2002, pp. 302-303.
[7] Z. Lao, et al., "1.3V Supply Voltage 38 GHz Static Frequency Divider," Elec. Let. 40 (5), 2004, pp. 295-296.
[8] M. Tiebout, "A CMOS Direct Injection-Locked Oscillator Topology as High-Frequency Low-Power Frequency Divider," IEEE J. of Solid-State Circuits, 39 (7), 2004, pp. 1170-1174.
[9] J. Lee, at al., "A 40-GHz Frequency Divider in 0.18 μm CMOS Technology," IEEE J. of Solid State Circuits 39 (4), 2004, pp. 594-601.

To overcome the deficiencies of the conventional twist-coupled toggle latch based frequency dividers, the present disclosure presents a new design that employs a phase-coherent transformer to obtain power-efficient, low phase noise frequency dividers that are tolerant of differential input phase mismatch.

SUMMARY

According to the present disclosure, phase-coherent differential structures are disclosed.

According to a first embodiment disclosed herein, a circuit is disclosed, comprising: a differential structure having a first circuit for a first input and a second circuit for a second input; and a phase-coherent transformer connected to the differential structure for storing magnetic energy reverberating between the first circuit and the second circuit in accordance with toggling of the first input and the second input.

According to a second embodiment disclosed herein, a method for manufacturing a phase-coherent differential structure is disclosed, comprising: selecting a differential structure having a first circuit for a first input and a second circuit for a second input; and connecting a phase-coherent transformer to the differential structure for storing magnetic energy reverberating between the first circuit and the second circuit in accordance with toggling of the first input and the second input.

According to a third embodiment disclosed herein, a method for dividing frequency of a signal is disclosed, comprising: selecting a phase-coherent frequency divider circuit comprising a differential structure connected to an energy reverberation mechanism; and transmitting said signal through the phase-coherent frequency divider circuit, wherein the energy reverberation mechanism stories magnetic energy reverberating in the differential structure.

In the following description, like reference numbers are used to identify like elements. Furthermore, the drawings are intended to illustrate mayor features of exemplary embodiments in a diagrammatic manner. The drawings are not intended to depict every feature of every implementation nor relative dimensions of the depicted elements, and are not drawn to scale.

DETAILED DESCRIPTION

In conventional latch based differential structures like, for example, frequency dividers, energy is stored in parasitics non-coherently. This wastes energy and generates noise due to the charging/discharging processes, resulting in power-hungry and high signal attenuation in high frequency applications. In contrast to this un-correlated energy storage mechanism, the phase coherent frequency dividers disclosed in the present disclosure store magnetic energy in a phase-coherent transformer (PCT) that includes two phase-coherent coupled differential inductors. The energy reverberation mechanism in the phase-coherent transformer makes the disclosed phase coherent frequency dividers power-efficient as they consume less power with increased division gain, with low phase noise and high operation efficiency, and tolerance for differential input phase mismatching.

Figure 1:
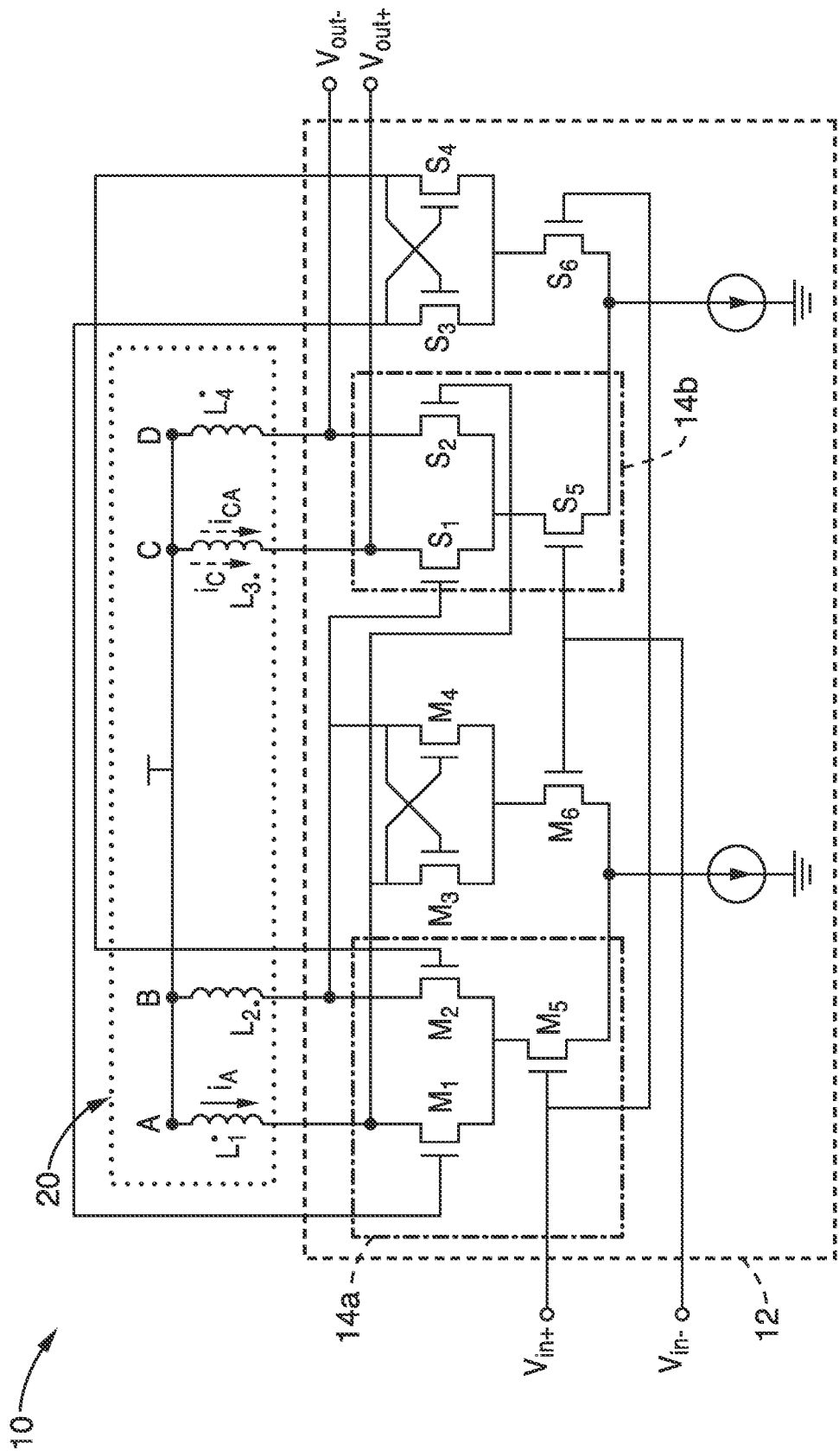
FIG. 1 depicts a master/slave (M/S) latch topology circuit according to the present disclosure.

In one exemplary embodiment, a phase-coherent transformer 20 may be implemented in a master / slave (M / S) latch topology circuit 10, as shown in FIG. 1. The circuit 10 consists of interconnected transistors $M_1,...M_6$, forming a Master latch and interconnected transistors $S_1,...S_6$, forming a Slave latch. The phase-coherent transformer 20 consists of inductors $L_1$ and $L_2$ of opposite polarity that are phase matched with inductors $L_3$ and $L_4$ that are also of opposite polarity. Circuit 10 depicts a differential structure 12 within which is shown a first circuit 14a and second circuit 14b.

To analyze the circuit 10, $V_{out+}$ and $V_{out-}$ are initially presumed to be high and low respectively. When the input signal $V_{in+}$ is high and $V_{in-}$ is low, the drain of a transistor $M_1$ is low due to a current $i_A$ flowing into the transistor $M_1$ from node A and the drain of a transistor $M_2$ is high. Because of the phase coherence between the inductors $L_1$, $L_2$ and the inductors $L_3$, $L_4$, there is an induced electromotive force (EMF) pointing from the drain of a transistor $S_1$ to node C helping the inductors $L_3$ and $L_4$ in the Slave latch to turn off. When $V_{in+}$ goes low and $V_{in-}$ becomes high, current $i_C$ flows from node C into the drain of the transistor $S_1$ as the current $i_A$ reduces to zero. It this the reduction of current $i_A$ that generates an induced current $i_{CA}$ that also flows from node C into the drain of the transistor $S_1$, providing extra power gain and accelerating the state change.

According to Faraday's induction law, $EMF=-d\phi_m/dt=\omega\phi_m$ and $di_A/dt=Md\phi_m/dt$, where $\phi_m$ is the magnetic flux linking the two differential inductors $L_1$ to $L_2$ and $L_3$ to $L_4$ and M is the mutual inductance. Therefore, the value of the induced current $i_{CA}$ depends on the rate of change in current $i_A$, and thus the signal frequency of $\omega$. The higher the input signal frequency, the larger the induced current $i_{CA}$ and the higher the incremental gain. As a result, instead of wasting energy by charging/discharging parasitics non-coherently in conventional frequency dividers, circuit 10 stores the magnetic energy in the phase-coherent transformer 20 that reverberates the energy back and forth between the Master and the Slave latches in accordance with the input toggling.

Figure 2:
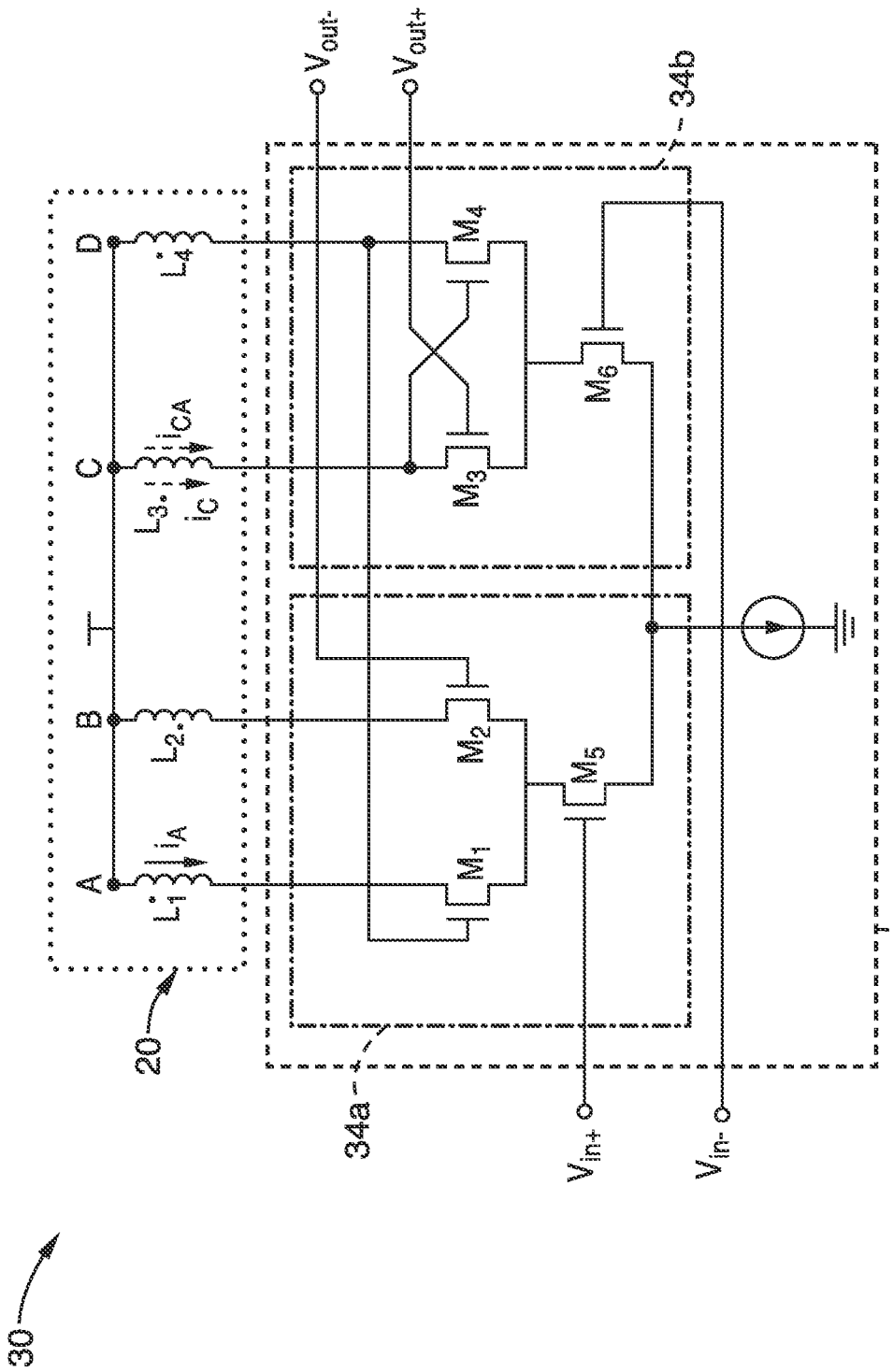
FIG. 2 depicts a master only (M/O) latch topology circuit according to the present disclosure.

In another exemplary embodiment, a phase-coherent transformer 20 may be implemented in a master only (M/O) latch topology circuit 30, as shown in FIG. 2. The circuit 30 consists of interconnected transistors $M_1$, $M_2$, forming the sensing pair and $M_3$, $M_4$ forming a latching pair. The phase-coherent transformer 20 consists of inductors $L_1$ and $L_2$ of opposite polarity that are phase matched with inductors $L_3$ and $L_4$ that are also of opposite polarity. Circuit 30 depicts a differential structure 32 within which is shown a first circuit 34a and second circuit 34b.

To analyze the circuit 30, $V_{out+}$ and $V_{out-}$ are initially presumed to be high and low respectively. When the input signal $V_{in+}$ is high and $V_{in-}$ is low, the drain of a transistor $M_1$ is low due to a current $i_A$ flowing into the transistor $M_1$ from node A and the drain of a transistor $M_2$ is high. Because of the inherent phase coherence between the inductors $L_1$, $L_2$ and the inductors $L_3$, $L_4$, there is an induced electromotive force (EMF) pointing from the drain of a transistor $M_3$ to node C helping the inductors $L_3$ and $L_4$ to turn off. When $V_{in+}$ goes low and $V_{in-}$ becomes high, current $i_C$ flows from node C into the drain of the transistor $M_3$ as the current $i_A$ reduces to zero. Like for the circuit 10 described above, the reduction of current $i_A$ in the circuit 30 generates an induced current $i_{CA}$ that also flows from node C into the drain of the transistor $M_3$, providing extra power gain and accelerating the state change.

As a result, a 2:1 frequency divider can be implemented in the master only (M/O) latch topology circuit 30 as the magnetic energy reverberates between the sensing/latching pairs once while the input signal toggles twice.

Circuits 10 and 30 may be fabricated with standard 0.18 μm CMOS technology. Because one skilled in the art can easily recognize that bipolar technologies can also be used to implement embodiments disclosed in the present disclosure and their equivalents, the implementation of the bipolar technologies will not be discussed in the present disclosure.

Figure 3B:
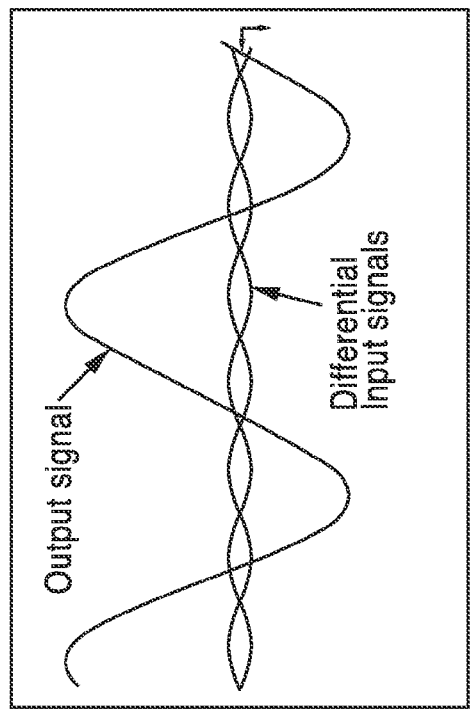
FIG. 3b depicts performance characteristics of the circuit in FIG. 2.
Figure 3A:
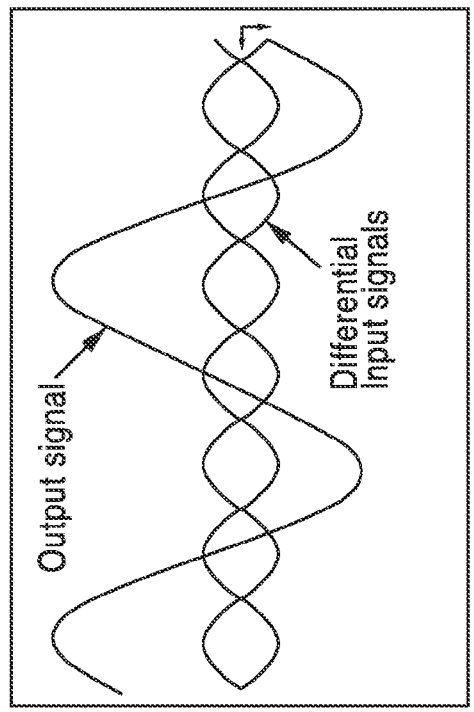
FIG. 3a depicts performance characteristics of the circuit in FIG. 1.
Figure 4:
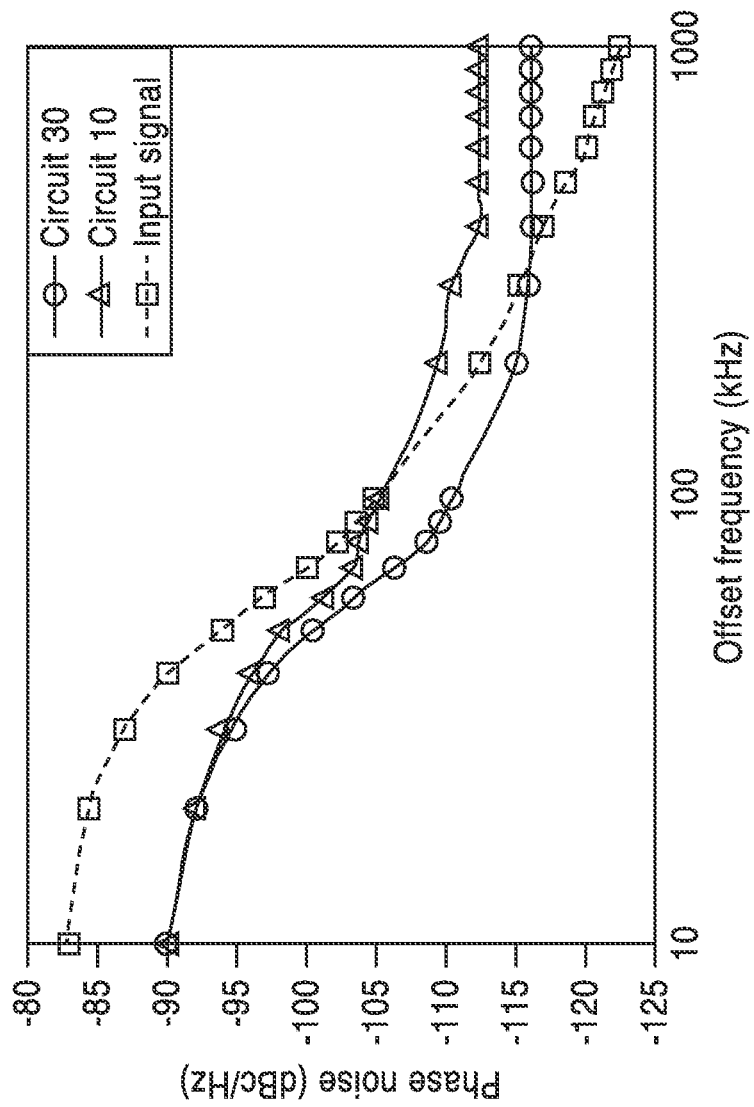
FIG. 4 depicts measured phase noise levels of the circuits in FIGS. 1 and 2 versus input signal noise level as a function of offset frequency.
Figure 5A:
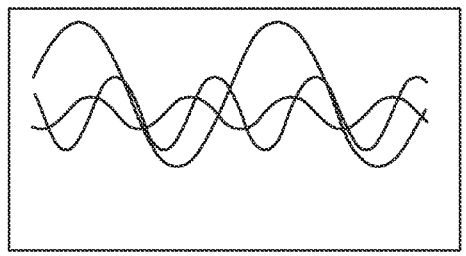
FIGS. 5a-h depict the output of circuit in FIG. 2 as the inputs are phase mismatched up to ±120°.
Figure 5E:
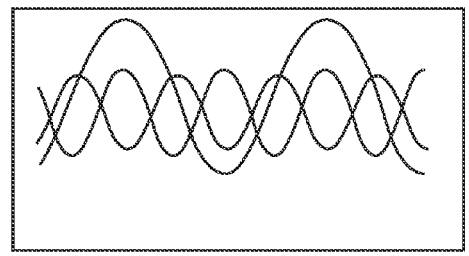
Figure 5B:
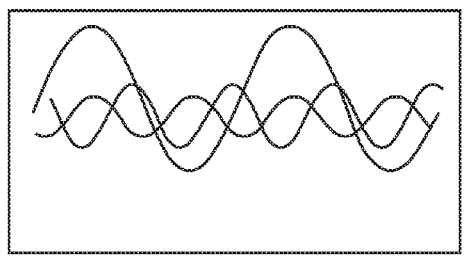
Figure 5F:
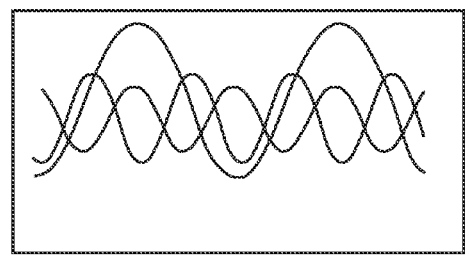
Figure 5C:
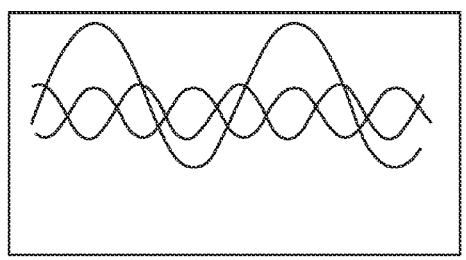
Figure 5G:
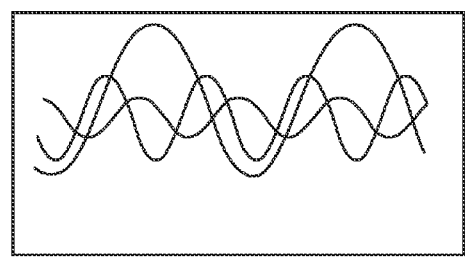
Figure 5D:
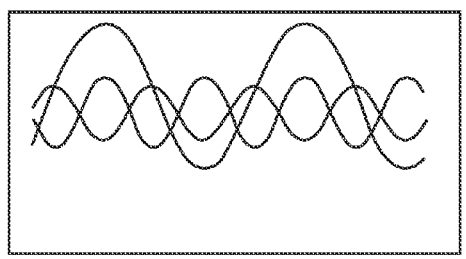
Figure 5H:
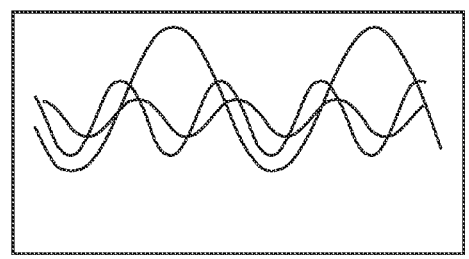
Figure 6:
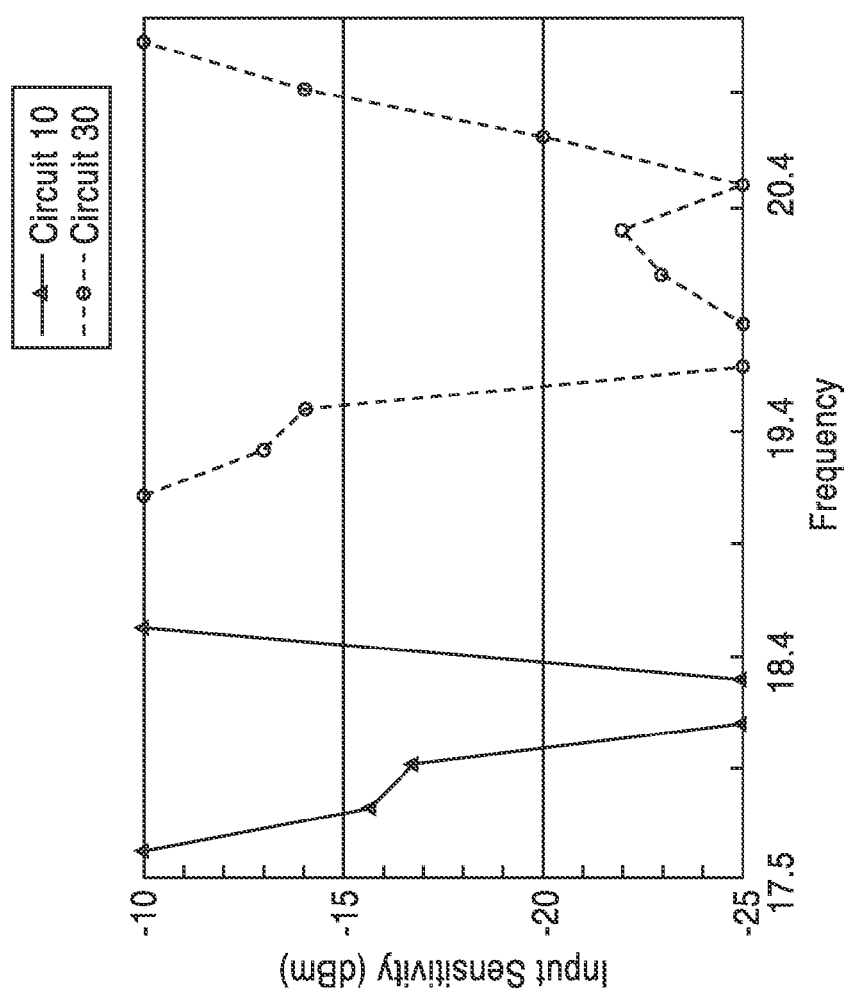
FIG. 6 depicts input sensitivity of circuits in FIGS. 1-2 versus frequency.
Figure 7:
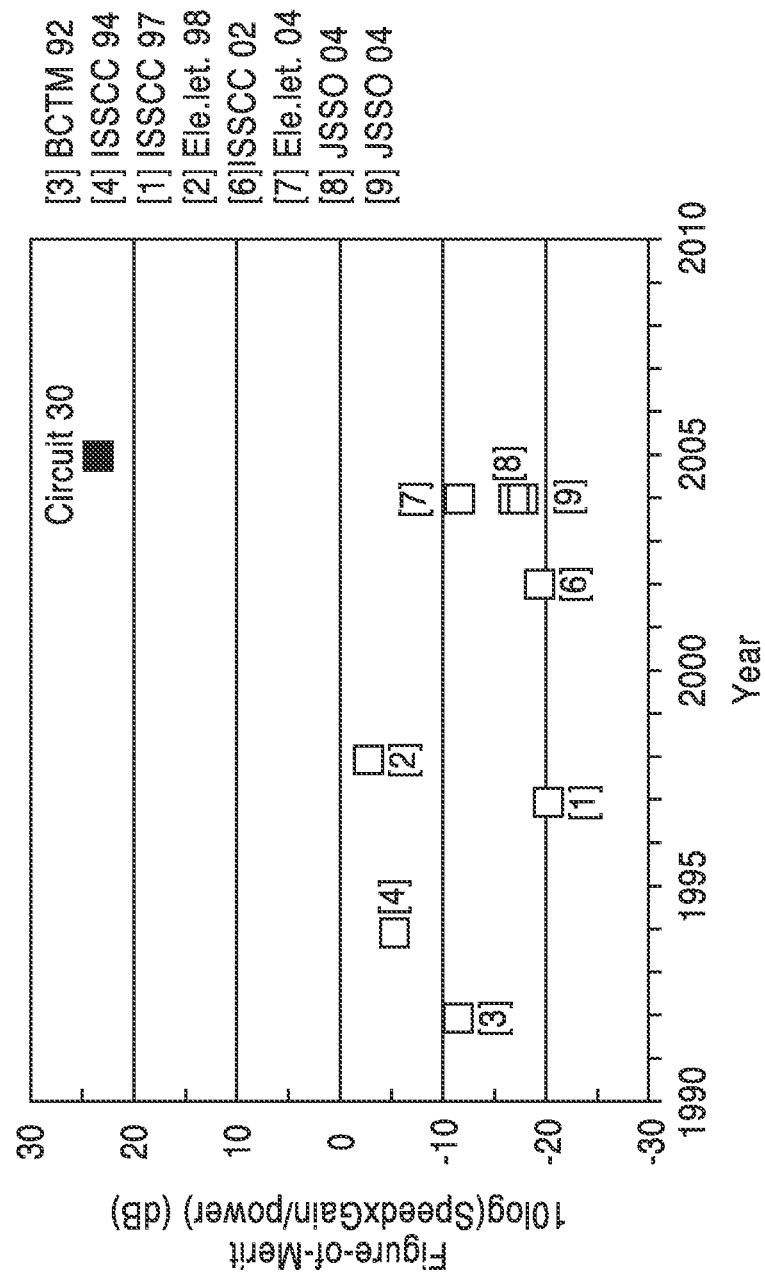
FIG. 7 depicts operation effectiveness of the circuit in FIG. 2 by comparing its figure-of merit (F.O.M.) with other high speed and low power divider designs known in the art.

FIGS. 3a-b, 4, 5a-h, 6 and 7 depict performance characteristics of circuits 10 and 30. Specifically, FIG. 3a depicts that circuit 10 having a large division gain with small power consumption when operating at $f_{in}$ =18 Ghz. FIG. 3b depicts that circuit 30 also has a large division gain with small power consumption when operating at $f_{in}$ =19.4 Ghz. FIG. 4 depicts measured phase noise levels of the circuits 10 and 30 versus input signal noise level as a function of offset frequency. FIGS. 5a-h depict output of circuit 30 as the inputs are phase mismatched up to ±120°. FIG. 6 depicts input sensitivity of circuits 10 and 30 versus frequency, wherein power supply voltage is 1.8V, the input power signal is lower than −10 dBm and the circuit 10 shows 1 GHz dividing range while circuit 30 shows 2 GHz dividing range. FIG. 7 depicts operation effectiveness of the circuit 30 by comparing its figure-of merit (F.O.M.) with other high speed and low power divider designs known in the art. As known in the art, the F.O.M. is defined by multiplying the dividing speed (the input signal frequency in Giga-Hz) with the output power gain and then dividing it by the total power consumption (in Watts), i.e. Speed×Gain/Power. As can be seen in FIG. 7, the circuit 30 is almost 27 dB more efficient than other divider designs known in the art.

One skilled in the art can easily appreciate that other differential structures, for example differential amplifiers, mixers, dynamic latches, registers and their equivalents, can also benefit from the use of a phase-coherent transformer as disclosed herein. A differential structure according to the present disclosure has connections and circuitry for both 0 and 180 degree phases of signal inputs and outputs and is able to suppress even harmonics and noise from interference caused by the substrate, ground and/or power supply.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

We claim:

1. A circuit, comprising:
a differential structure having a first circuit for accepting a first input and a second circuit for accepting a second input;
a phase-coherent transformer connected to the differential structure for storing magnetic energy reverberating between the first circuit and the second circuit in accordance with toggling of the first input and the second input;
wherein the differential structure is a frequency divider having a master only (M/O) latch topology.

2. The circuit as recited in claim 1, wherein the phase-coherent transformer comprises a first pair of inductors of opposite polarity to one another and connected to the first circuit, and a second pair of inductors of opposite polarity to one another and connected to the second circuit, wherein the first pair of inductors are phase coherent with the second pair of inductors.

3. The circuit as recited in claim 1, wherein the differential structure comprises one or more MOS transistors.

4. The circuit as recited in claim 1, wherein the differential structure comprises one or more bipolar transistors.

5. The circuit as recited in claim 1, wherein the first input of the differential structure is 180 degrees out of phase with the second input of the differential structure.

6. A circuit, comprising:
a differential structure having a first transistor circuit for accepting a first input and a second transistor circuit for accepting a second input;
a phase-coherent transformer connected to the differential structure for storing magnetic energy reverberating between the first transistor circuit and the second transistor circuit in accordance with toggling of the first input and the second input.

7. The circuit as recited in claim 6, wherein the differential structure is selected from the group consisting of differential amplifiers, mixers, frequency dividers, dynamic latches and registers.

8. The circuit as recited in claim 6, wherein the phase-coherent transformer comprises a first pair of inductors of opposite polarity to one another and connected to the first transistor circuit, and a second pair of inductors of opposite polarity to one another and connected to the second transistor circuit, wherein the first pair of inductors are phase coherent with the second pair of inductors.

9. The circuit as recited in claim 6, wherein the first input of the differential structure is 180 degrees out of phase with the second input of the differential structure.

10. The circuit as recited in claim 6, wherein said differential structure comprises at least one pair of sense transistors and one pair of latching transistors.

11. The circuit as recited in claim 6, wherein said phase-coherent transformer has a plurality of windings, with one winding coupled to each opposing side of the differential structure in each of said first transistor circuit and said second transistor circuit.

12. A circuit, comprising:
a differential structure having a first transistor circuit for accepting a first input and a second transistor circuit for accepting a second input, with said first and second inputs comprising a differential input signal; and
a phase-coherent transformer connected to the differential structure for storing magnetic energy reverberating between the first transistor circuit and the second transistor circuit in accordance with toggling of the differential input signal;
wherein said differential structure comprises at least one pair of sense transistors and one pair of latching transistors.

13. The circuit as recited in claim 12, wherein the phase-coherent transformer comprises a first pair of inductors of opposite polarity to one another and connected to the first transistor circuit, and a second pair of inductors of opposite polarity to one another and connected to the second transistor circuit, wherein the first pair of inductors are phase coherent with the second pair of inductors.

14. The circuit as recited in claim 12, wherein the differential structure comprises one or more MOS transistors.

15. The circuit as recited in claim 12, wherein the differential structure comprises one or more bipolar transistors.

16. The circuit as recited in claim 12, wherein the first input of the differential structure is 180 degrees out of phase with the second input of the differential structure.

17. The circuit as recited in claim 12, wherein the differential structure is selected form the group consisting of differential amplifiers, mixers, frequency dividers, dynamic latches and registers.

* * * * *